United States Patent [19]
Broughton

[11] Patent Number: 5,315,164
[45] Date of Patent: May 24, 1994

[54] ADAPTIVE CLOCK DUTY CYCLE CONTROLLER

[75] Inventor: Robert S. Broughton, Beaverton, Oreg.

[73] Assignee: NEC America, Inc., Hillsboro, Oreg.

[21] Appl. No.: 67,069

[22] Filed: May 26, 1993

[51] Int. Cl.$^5$ ............... H03K 3/017; H03K 5/153
[52] U.S. Cl. ........................ 307/265; 307/358; 328/11
[58] Field of Search ............ 307/265, 358; 328/111

[56] References Cited
U.S. PATENT DOCUMENTS 4,071,781  1/1978  Kayalioglu ............... 307/265

Primary Examiner—Margaret Rose Wambach
Attorney, Agent, or Firm—Sughrue, Mion, Zinn, Macpeak & Seas

[57] ABSTRACT

An adaptive clock duty cycle controller which generates a dc error signal that is supplied to a logic device, such as a logic inverter or a logic buffer, which outputs a specified duty cycle clock signal. The output of the logic device is supplied to a positive peak detector, a negative peak detector and an average signal level detector. The output of the positive peak detector and the negative peak detector are supplied to a mid-peak generating circuit which generates a signal for setting and maintaining the desired duty cycle. The signal output by the average signal level detector represents the average value of the output of the logic device. The signal output by the mid-peak generating circuit is compared with the signal output by the average signal level detector by an operational amplifier. The output of the operational amplifier represents the error signal which is supplied back to the input of the logic device to control the output of the logic device to the desired duty cycle.

5 Claims, 5 Drawing Sheets

FUNCTIONAL DIAGRAM

FUNCTIONAL DIAGRAM

SINE-WAVE INPUT SIGNAL TO LOGIC INVERTER

INPUT THRESHOLD LEVEL OF LOGIC INVERTER

OUTPUT OF LOGIC INVERTER

INPUT THRESHOLD LEVEL OF LOGIC INVERTER

OUTPUT OF LOGIC INVERTER

SCHEMATIC DIAGRAM

ADAPTIVE CLOCK DUTY CYCLE CONTROLLER

BACKGROUND OF THE INVENTION

The present invention relates to an adaptive clock duty cycle controller for adaptively controlling and regulating the duty cycle of a digital clock signal.

The present invention controls a logic device such as a logic inverter or a logic buffer to produce a stable clock signal having a known duty cycle. A stable and known duty cycle is required in many applications where signal fidelity of clocked data is important. One such area of application is in the generation of bipolar digital telephone interface pulses for digital telephone hierarchies such as DS1, DS3, etc.

A conventional clock duty cycle controller used for maintaining a duty cycle of 50 percent, for example, doubles the frequency of the clock signal and then divides that doubled frequency by two using a flip-flop, such that the conventional duty cycle controller operates at an integer multiple of a selected frequency which is obtained by an oscillator. The conventional duty cycle controller is disadvantageous since the current consumption is high due to the high frequency of the oscillator, and the output of the oscillator varies which results in an unstable duty cycle.

In addition, the conventional duty cycle controller is limited as to the type of logic devices which may be used for outputting the duty cycle signal. More particularly, logic devices operate within specified frequency ranges and when a logic device of a particular technology is operating near maximum capability, it may not be possible to operate such a logic device at two times the clock frequency.

SUMMARY OF THE INVENTION

It is an object of the present invention to provide an adaptive clock duty cycle controller which can produce a stable duty cycle without requiring high current consumption.

A further object of the present invention is to provide an adaptive clock duty cycle controller which operates on a clock signal at the clock frequency, and not at a multiple of the clock frequency to provide a stable duty cycle.

Still a further object of the present invention is to provide an adaptive clock duty cycle controller which is capable of controlling a wide range of duty cycle values.

The above-mentioned objects of the invention are achieved by an adaptive clock duty cycle controller which includes a logic device, which may be one of a logic inverter or a logic buffer, for generating a signal having a stable duty cycle where the output of the logic device is monitored by a control circuit including a positive peak detector, a negative peak detector, a mid-peak generating circuit, and an average signal level detector, such that the output of the mid-peak generating circuit is compared to the output of the average signal level detector to generate an error signal which is added to the input signal applied to the input of the logic device. The error signal operates to shift the point at which the input signal crosses the internal threshold level of the logic device to maintain a predetermined duty cycle.

DETAILED DESCRIPTION OF THE PREFERRED EMBODIMENT

The present invention will be described with reference to the accompanying drawings. For the purposes of description, a logic inverter is utilized as the logic device. However, it is to be understood that a non-inverting logic device such as a logic buffer may be utilized.

Figure 1:
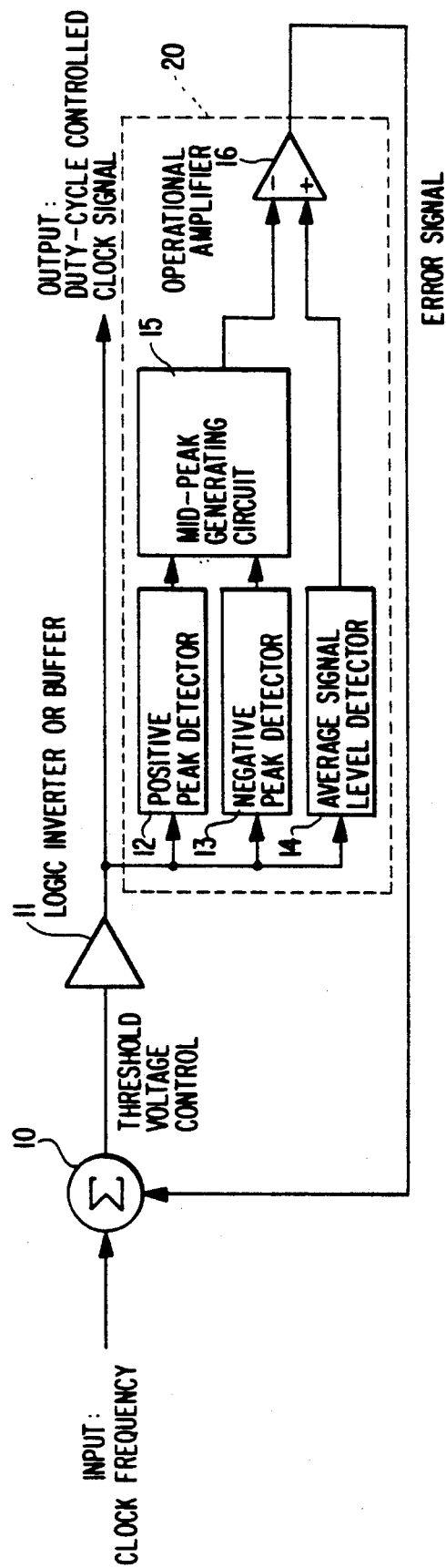
FIG. 1 is a block diagram illustrating the arrangement of the adaptive clock duty cycle controller according to the present invention.
Figure 2A:
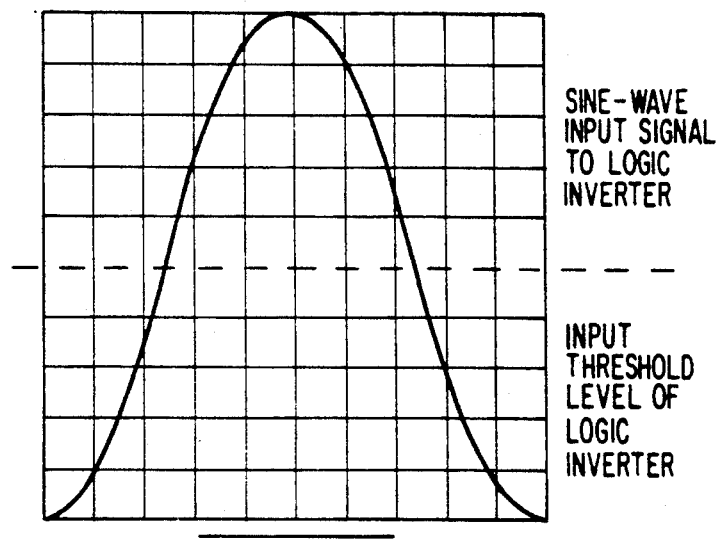
FIGS. 2(a) and 2(b) respectively illustrate a sinusoidal signal applied to the logic device and a square wave output of the logic device.
Figure 2B:
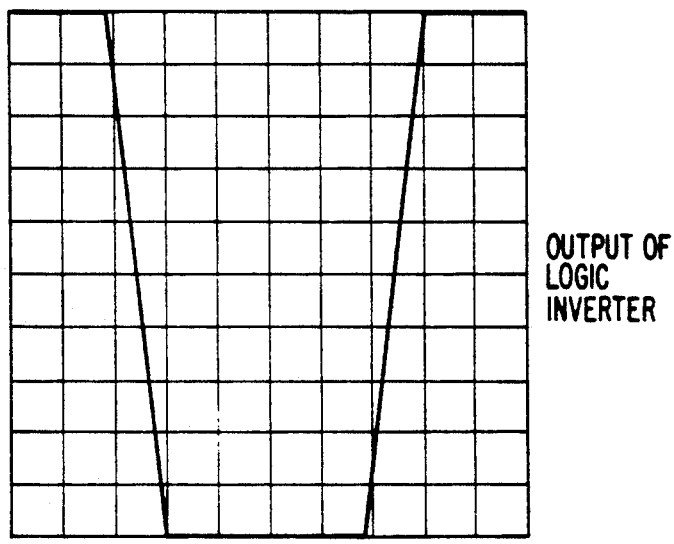
Figure 3A:
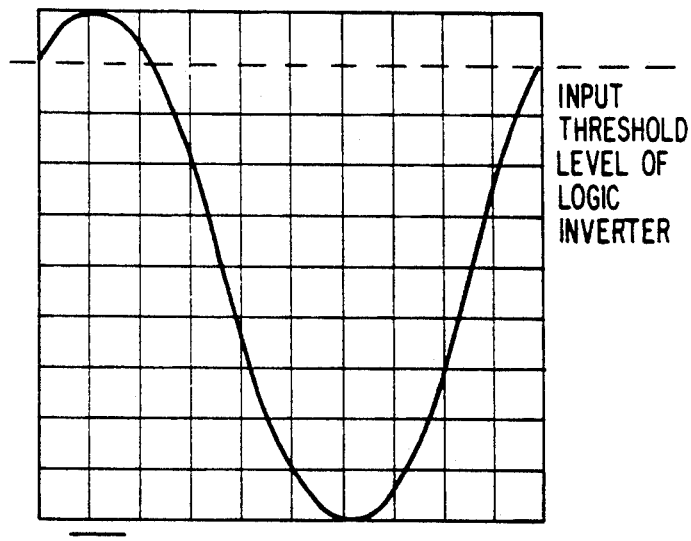
FIGS. 3(a) and 3(b) respectively illustrate an example of a sinusoidal input signal supplied to the logic device crossing the internal threshold of the logic device and an example of a resulting square wave output of the logic device.
Figure 3B:
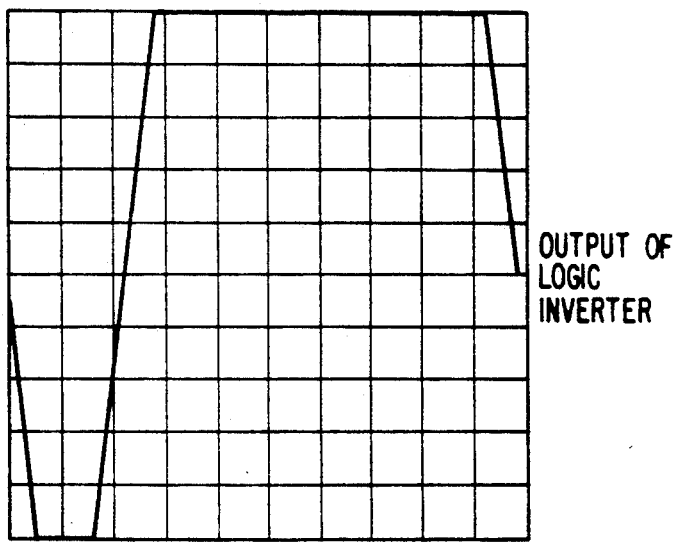
Figure 4A:
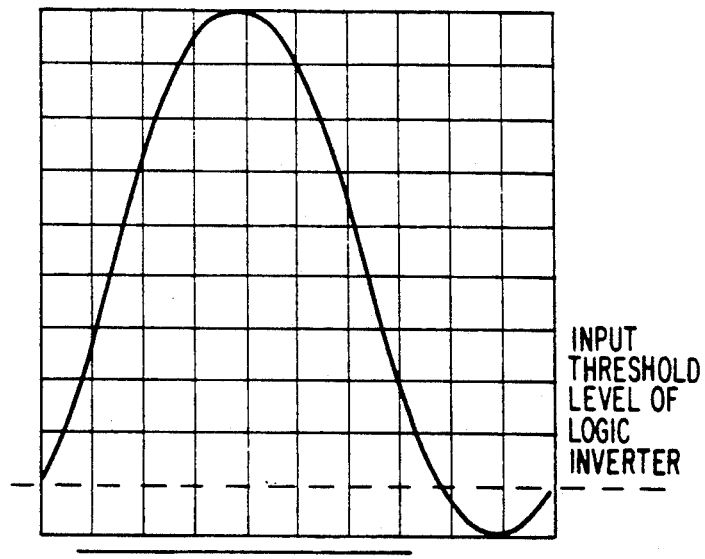
FIGS. 4(a) and 4(b) respectively illustrate another example of a sinusoidal input signal supplied to the logic device crossing the internal threshold of the logic device and an example of a resulting square wave output of the logic device.
Figure 4B:
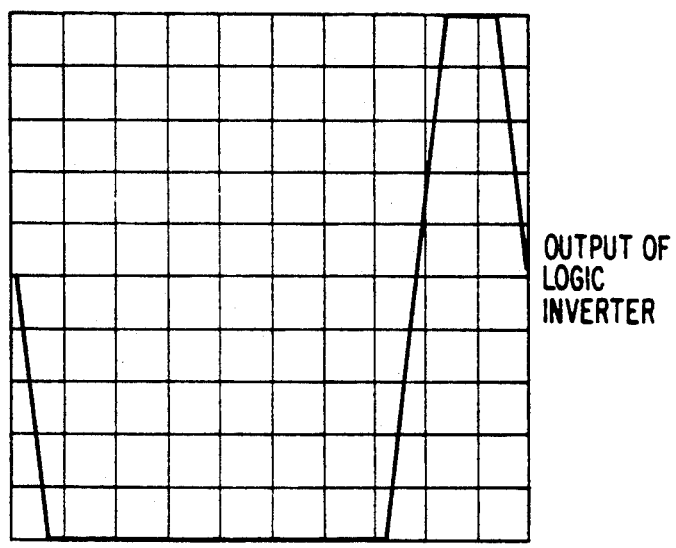

FIG. 1 illustrates the arrangement of the adaptive clock duty cycle controller according to the present invention. An external clock frequency source is connected to the input of a logic inverter 11. The external clock frequency source generates an ac signal which is supplied to the input of the logic inverter 11. The logic inverter 11 operates as a linear amplifier for the input signal and generates a square wave output signal in response to the sinusoidal input signal, as illustrated in FIGS. 2(a) and 2(b).

The logic inverter 11 is characterized as including an internally set threshold voltage. The threshold voltage for the logic inverter 11 is the point about which the linear input amplifying region of the logic inverter 11 is centered. That is, any signal within the linear amplifying region or near the threshold voltage is amplified. The application of a dc voltage to the ac input signal operates to shift the point on the ac signal which crosses the internal threshold of the logic inverter 11 to shift the level of the signal output by the logic inverter 11, as illustrated in FIGS. 3(a), 3(b), 4(a) and 4(b).

According to the present invention, the duty cycle controller sums the ac-coupled external clock frequency signal with a dc voltage which represents an error signal that is varied to maintain the desired duty cycle at the output of the logic inverter 11. The dc error signal has the effect of varying the duty cycle at the output of the logic inverter 11 by varying the point at which the input signal crosses the threshold of the logic inverter 11.

The error signal is generated by an adaptive duty cycle controller 20 which includes a positive peak detector 12, a negative peak detector 13, an average signal level detector 14, a mid-peak generating circuit 15 and an operational amplifier 16. The output of the logic inverter 11 is connected to the positive peak detector 12, the negative peak detector 13, and the average signal level detector 14. The output signals of these detectors are used to determine the error signal which is fed back to the input of the logic inverter 11, as illustrated by the summation device 10.

For the purposes of this description, it is to be assumed that the desired duty cycle at the output of the logic inverter 11 is 50 percent, that is, the signal output by the logic inverter 11 is "High" for one-half of the period of the output frequency, and is "Low" for the other one-half of the period. However, the duty cycle controller according to the present invention is capable of controlling a wide range of duty cycle values other than 50 percent which will be discussed hereinbelow.

The output terminals of the positive peak detector 12 and the negative peak detector 13 are connected to the two input terminals of the mid-peak generating circuit 15. For the desired duty cycle of 50 percent, the mid-peak generating circuit 15 is set to output a mid-peak signal having a voltage level half-way between the most positive peak voltage (maximum voltage) and the most negative peak voltage (minimum voltage) supplied from the positive peak detector 12 and the negative peak detector 13, respectively. The output of the average signal level detector 14 is a dc voltage corresponding to the average signal level of the points on the output waveform from the logic inverter 11.

The error signal is determined from the signal output by the mid-peak generating circuit 15 and the signal output by the average signal level detector 14. The operational amplifier 16 compares the output signal from the mid-peak generating circuit 15 with the output signal from the average signal level detector 14.

The mid-peak generating circuit 15 tracks the most positive peak and the most negative peak on the signal output by the logic inverter 11 in addition to any dc offset. The voltage output by the average signal level detector 14 is directly proportional to the duty cycle of the output waveform of the logic inverter 11. When the average value of the signal output by the logic inverter 11 is compared to the mid-peak signal, a dc signal representing the error value is generated. The dc error signal is added to the ac signal supplied to the input of the logic inverter 11 and provides for the control of the duty cycle of the signal output by the logic inverter 11 by adjusting the point on the ac signal waveform which crosses the internal threshold of the logic inverter 11.

When the duty cycle of the signal output by the logic inverter 11 is exactly 50 percent, the average signal level and the mid-peak signal level will be exactly the same. If the duty cycle of the signal output by the logic inverter 11 increases to a value higher than 50 percent, the level of the signal output by the average signal level detector 14 will be greater than the level of the signal output by the mid-peak generating circuit 15. The difference between the signals output by the mid-peak generating circuit 15 and the average signal level detector 14 is detected by the operational amplifier 16 which outputs an error signal to the input of the logic inverter 11. The application of the error signal to the ac input signal operates to shift the point at which the input signal crosses the threshold of the logic inverter 11 to output the desired duty cycle.

Similarly, if the duty cycle of the signal output by the logic inverter 11 should fall below the preselected value of 50 percent, the level of the signal output by the average signal level detector 14 will be less than the level of the signal output by the mid-peak generating circuit 15. Again, the operational amplifier 16 detects this difference and outputs an error signal to the input of the logic inverter 11 to correct the output of the logic inverter 11 back to the desired duty cycle of 50 percent.

Figure 5:
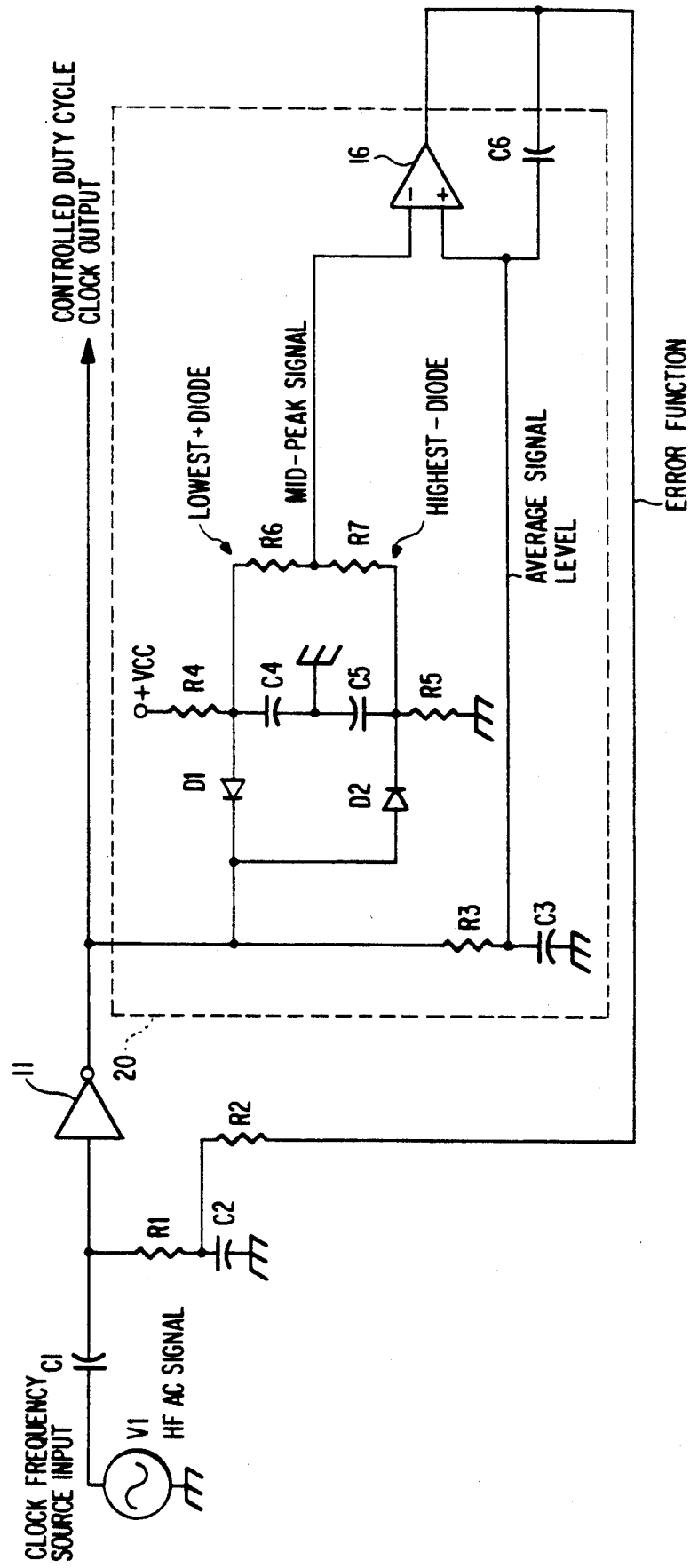
FIG. 5 is a circuit diagram illustrating a detailed arrangement of the adaptive clock duty cycle controller according to the present invention.

A detailed arrangement of the adaptive clock duty cycle controller 20 is illustrated in FIG. 5. A clock frequency input source is ac coupled to the input of a logic inverter 11 by a capacitor C1. The logic inverter 11 outputs the controlled duty cycle clock signal. In addition, the output of the logic inverter 11 is monitored by the adaptive clock duty cycle controller 20 connected to the output of the logic inverter 11.

The positive peak detector 12 includes diode D2, capacitor C5 and resistor R5. The negative peak detector 13 comprises diode D1, capacitor C4 and resistor R4. The mid-peak generating circuit 15 includes resistors R6 and R7. The negative peak detector 13 generates a signal representing the minimum voltage on the signal output by the logic inverter 11 across capacitor C4. The positive peak detector 12 generates a signal representing the maximum voltage on the signal output by the logic inverter 11 across capacitor C5. Therefore, capacitors C4 and C5 respectively track the most negative and the most positive voltages on the signal output by the logic inverter 11. The mid-peak signal is determined by the difference between the positive peak voltage and the negative peak voltage multiplied by the resistance ratio of resistors R6 and R7.

Resistor R3 and capacitor C3 represent the average signal level detector 14. The signal across capacitor C3 is a dc voltage which represents the average of all the points on the signal output by the logic inverter 11.

In the positive peak detector 12, diode D2 becomes forward biased and conducts whenever the instantaneous voltage at the output of the logic inverter 11 minus one diode voltage drop (about 0.6 volts) is greater than the voltage across capacitor C5. Initially, the voltage across capacitor C5 is zero. The signal output by the logic inverter 11 operates to charge capacitor C5. Over several cycles, the voltage across capacitor C5 becomes equal to the most positive instantaneous peak voltage of the signal output by the logic inverter 11. The capacitor C5 tracks changes in the peaks of the logic inverter output signal through resistor R5 which slowly discharges capacitor C5 when the voltage across capacitor C5 becomes larger than the instantaneous peak voltage. Once capacitor C5 is fully charged to the positive peak voltage minus the diode voltage drop, diode D2 slightly conducts on each successive cycle of the signal output by the logic inverter 11 to maintain the peak voltage across capacitor C5. Therefore, the voltage across capacitor C5 "hugs" the peak voltage and increases or decreases as the peak voltage at the output of the logic inverter increases or decreases.

The negative peak detector 13 operates in a manner similar to that of the positive peak detector 12, except for a change in polarities. Diode D1 conducts whenever the instantaneous voltage at the output of the logic inverter 11 is less than the voltage across capacitor C4 plus one diode voltage drop (about 0.6 volts). Initially, the voltage across capacitor C4 is zero. The signal output by the logic inverter 11 charges capacitor C4. Over several cycles, the voltage across capacitor C4 becomes equal to the most negative instantaneous peak voltage of the signal output by the logic inverter 11. When the voltage across the capacitor C4 is greater than the most negative point on the waveform output by the logic inverter 11, D1 conducts discharging the voltage across capacitor C4 as necessary to set the voltage across capacitor C4 to equal the negative peak voltage output by the logic inverter 11. The effect of this operation is to produce a voltage across capacitor C4 that is the same as the most negative voltage output by the logic inverter 11. This voltage will track any changes in the amplitude of the clock signal at the output of the logic inverter 11.

Therefore, the positive peak detector 12 and the negative peak detector 13 continuously monitor the peak values of the signal output by the logic inverter 11. Similarly, the average signal level detector 14 continuously monitors the average value of the waveform output by the logic inverter 11.

The voltages across capacitors C4 and C5 represent the most negative and most positive voltages found on the waveform of the signal output by the logic inverter 11, respectively. A mid-peak signal having a voltage level half-way between the two peak voltages is generated by setting the value of the resistors R6 and R7 of the mid-peak generating circuit 15 equal to each other. At the point of connection of resistors R6 and R7 is the mid-peak signal level of the two peak voltages. This mid-peak signal tracks any changes in the signal output by the logic inverter 11.

The operational amplifier 16 compares the average signal level output by the average signal level detector 14 and the level of the mid-peak signal output by the mid-peak generating circuit 15 and outputs an error signal which is supplied to the input of the logic inverter 11. The operational amplifier 16 is shown as an integrator with the connection of capacitor C6 between the output of the operational amplifier 16 and the non-inverting input of the operational amplifier 16. This integration is useful for slowing the response of the feedback to the input of the logic inverter 11.

The arrangement illustrated in FIG. 5 further includes a capacitor C2 and resistors R1 and R2. The value of capacitor C2 is large so that the resistor R1 becomes the load to the current supplied by the input of the logic inverter 11. Resistor R1 acts as both a termination or load for the clock frequency input source and as a source or sink for the error signal from the operational amplifier 16 to the input of the logic inverter 11. The operation of R1, C2 and R2 is bi-directional. Resistor R2 and capacitor C2 operate as a low-pass filter for the error signal supplied from the operational amplifier 16 to the input of the logic inverter 11. From the direction of the clock frequency input source, the operation of R1, C2 and R2 is that of a termination for the high-frequency energy of the clock voltage waveform.

After a period of time for stabilization of the system, the operational amplifier 16 will compare the average signal level and the mid-peak signal level and adjust its output accordingly so that the level of the signals output by the average signal level detector 14 and the mid-peak generating circuit 15 are the same for the desired 50 percent duty cycle. As this adjustment occurs, the input voltage of the logic inverter 11 will be adjusted to the value necessary to support the desired duty cycle.

The adaptive clock duty cycle controller according to the present invention is capable of controlling a logic device to duty cycle values other than the preceding example of 50 percent by the appropriate selection of the values of resistors R6 and R7 within the mid-peak generating circuit 15, where resistors R6 and R7 may be variable resistors to easily facilitate a change of the duty cycle. The ratio of these two resistor values directly sets the duty cycle that will be maintained by changing the value of the mid-peak signal which, in turn, changes the value of the error signal to be supplied to the input of the logic inverter 11. For the 50 percent duty cycle example previously discussed, the values of resistors R6 and R7 are equal. However, when the value of resistor R6 is 1KΩ and the value of resistor R7 is 3KΩ, for example, the duty cycle is 25 percent. When the value of resistor R6 in the previous example is changed to 3KΩ while the value of resistor R7 is changed to 1KΩ, the duty cycle is 75 percent.

The adaptive clock duty cycle controller described herein may be applied to any kind of logic inverter or logic buffer from any family of logic devices. For example, the present invention is capable of controlling, and is not limited to, logic devices from the TTL, ECL, CML, and CMOS logic families.

When the logic device is a TTL device, a small current is supplied by the input of the logic inverter 11 through resistors R1 and R2 to the output of the operational amplifier 16 once the system has reached a state of equilibrium. The error signal from the operational amplifier 16 opposes the current supplied from the input of the logic inverter 11. The operational amplifier 16 acts as a sink for the small current output by the logic inverter 11.

When a logic inverter is controlled by the adaptive duty cycle controller, the inverting input of the operational amplifier is connected to the output of the mid-peak generating circuit 15 and the non-inverting input of the operational amplifier 16 is connected to the output of the average signal level detector 14. This arrangement produces the correct polarity of change for the error signal to be supplied to the input of the logic inverter 11. When the adaptive duty cycle controller is arranged to control a logic buffer (non-inverting logic device), the non-inverting input of the operational amplifier 16 is connected to the output of the mid-peak generating circuit 15 and the inverting input of the operational amplifier 16 is connected to the output of the average signal level detector 14.

The adaptive clock duty cycle controller according to the present invention provides an adaptive duty cycle controller which generates a dc output signal representing an error signal that is required to maintain a particular duty cycle based upon the signal output by a logic device, such that a mid-peak signal determined from the output of the logic device is compared to the average signal level of the signal output by the logic device to determine the error signal. Moreover, the present invention provides a single control circuit of simple design which is capable of maintaining an arbitrary duty cycle.

What is claimed is:

1. A duty cycle controller for maintaining a predetermined duty cycle, said duty cycle controller comprising:

signal generating means for generating an output signal having a predetermined duty cycle;

a positive peak detecting means for detecting a positive peak of said output signal from said signal generating means;

a negative peak detecting means for detecting a negative peak of said output signal from said signal generating means;

a mid-peak generating means for generating a mid-peak signal based upon an output signal from said positive peak detecting means and an output signal from said negative peak detecting means;

an average signal level detecting means for detecting an average signal level of said output signal from said signal generating means; and comparing means for comparing said mid-peak signal and said average signal level, and for generating an error signal that is supplied to an input of said signal generating means for maintaining said predetermined duty cycle of said output signal from said signal generating means.

2. The duty cycle controller as claimed in claim 1, wherein said mid-peak generating means includes a first resistor connected to an output of said negative peak detecting means and a second resistor connected to an output of said positive peak detecting means, and wherein said first resistor and said second resistor are connected together at a common connecting point, wherein said mid-peak signal is supplied to said comparing means from said common connecting point and said predetermined duty cycle is determined by the respective values of said first resistor and said second resistor.

3. A duty cycle controller for maintaining a predetermined duty cycle, said duty cycle controller comprising:

signal generating means for generating an output signal having a predetermined duty cycle;

a positive peak detecting means for detecting a positive peak of said output signal from said signal generating means;

a negative peak detecting means for detecting a negative peak of said output signal from said signal generating means;

a mid-peak generating means for generating a mid-peak signal based upon an output signal from said positive peak detecting means and an output signal from said negative peak detecting means;

an average signal level detecting means for detecting an average signal level of said output signal from said signal generating means; and comparing means for comparing said mid-peak signal and said average signal level, and for generating an error signal that is supplied to an input of said signal generating means for maintaining said predetermined duty cycle of said output signal from said signal generating means;

wherein said mid-peak generating means includes a first resistor connected to an output of said negative peak detecting means and a second resistor connected to an output of said positive peak detecting means, and wherein said first resistor and said second resistor are connected together at a common connecting point, wherein said mid-peak signal is supplied to said comparing means from said common connecting point and said predetermined duty cycle is determined by the respective values of said first resistor and said second resistor;

wherein said negative peak detecting means includes a first capacitor connected to a power supply through a third resistor and connected to ground, and further including a first diode having an anode connected at a point of connection between said first capacitor and said third resistor and a cathode connected to an output of said signal generating means, and wherein said first resistor in said mid-peak generating means is connected to said negative peak detecting means at said point of connection between said third resistor and said first capacitor.

4. A duty cycle controller for maintaining a predetermined duty cycle, said duty cycle controller comprising:

signal generating means for generating an output signal having a predetermined duty cycle;

a positive peak detecting means for detecting a positive peak of said output signal from said signal generating means;

a negative peak detecting means for detecting a negative peak of said output signal from said signal generating means;

a mid-peak generating means for generating a mid-peak signal based upon an output signal from said positive peak detecting means and an output signal from said negative peak detecting means;

an average signal level detecting means for detecting an average signal level of said output signal from said signal generating means; and comparing means for comparing said mid-peak signal and said average signal level, and for generating an error signal that is supplied to an input of said signal generating means for maintaining said predetermined duty cycle of said output signal from said signal generating means;

wherein said mid-peak generating means includes a first resistor connected to an output of said negative peak detecting means and a second resistor connected to an output of said positive peak detecting means, and wherein said first resistor and said second resistor are connected together at a common connecting point, wherein said mid-peak signal is supplied to said comparing means from said common connecting point and said predetermined duty cycle is determined by the respective values of said first resistor and said second resistor; and wherein said positive peak detecting means includes a fourth resistor connected in parallel with a second capacitor, and further including a second diode having an anode connected to an output of said signal generating means and a cathode connected at a point of connection between said fourth resistor and said second capacitor, and wherein said second resistor in said mid-peak generating means is connected to said positive peak detecting means at said point of connection between said fourth resistor and said second capacitor.

5. A duty cycle controller for maintaining a predetermined duty cycle, said duty cycle controller comprising:

signal generating means for generating an output signal having a predetermined duty cycle;

a positive peak detecting means for detecting a positive peak of said output signal from said signal generating means;

a negative peak detecting means for detecting a negative peak of said output signal from said signal generating means;

a mid-peak generating means for generating a mid-peak signal based upon an output signal from said positive peak detecting means and an output signal from said negative peak detecting means;

an average signal level detecting means for detecting an average signal level of said output signal from said signal generating means;

comparing means for comparing said mid-peak signal and said average signal level, and for generating an error signal that is supplied to an input of said signal generating means for maintaining said predetermined duty cycle of said output signal from said signal generating means; said duty cycle controller;

a first resistor connected to an input of said signal generating means and connected to ground through a first capacitor; and a second resistor connected to a node between said first resistor and said first capacitor and further connected to an output of said comparing means, wherein operation of said first resistor, said first capacitor and said second resistor is bi-directional such that said first resistor and said first capacitor operate as a load for a signal supplied to said input of said generating means and said first capacitor and said second resistor operate as a low-pass filter for said error signal supplied from said comparing means, said first resistor further operating as a source for said error signal supplied to said input of said generating means.

* * * * *